(12) United States Patent
Borden (10) Patent No.: US 7,078,711 B2
(45) Date of Patent: Jul. 18, 2006

(54) MATCHING DOSE AND ENERGY OF MULTIPLE ION IMPLANTERS

(75) Inventor: Peter G Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 10/779,072

(22) Filed: Feb. 13, 2004

(65) Prior Publication Data

US 2005/0181524 A1 Aug. 18, 2005

(51) Int. Cl.
*H01J 37/304* (2006.01)
(52) U.S. Cl. .................. 250/492.21; 356/369
(58) Field of Classification Search .......... 250/492.21; 356/369
See application file for complete search history.

(56) References Cited

U.S. PATENT DOCUMENTS

| | | | |
|---|---|---|---|
| 5,042,952 A | 8/1991 | Opsal et al. ................ 356/432 |
| 5,861,362 A | 1/1999 | Rohner .................. 250/492.21 |
| 5,862,054 A | 1/1999 | Li ......................... 364/468.28 |
| 6,113,733 A | 9/2000 | Eriguchi et al. ............ 156/345 |
| 6,157,199 A | 12/2000 | Park .......................... 324/752 |
| 6,408,220 B1 | 6/2002 | Nulman ...................... 700/121 |
| 6,417,515 B1 | 7/2002 | Barrett et al. .......... 250/492.21 |
| 6,426,644 B1 | 7/2002 | Borden et al. ............... 324/765 |
| 6,483,594 B1 | 11/2002 | Borden et al. ............. 356/502 |
| 6,489,801 B1 | 12/2002 | Borden et al. ............. 324/766 |
| 6,656,749 B1 | 12/2003 | Paton et al. .................... 438/5 |
| 6,694,284 B1 | 2/2004 | Nikoonahad et al. ....... 702/155 |
| 6,734,968 B1 | 5/2004 | Wang et al. ................. 356/369 |
| 6,804,003 B1 | 10/2004 | Wang et al. ................. 356/369 |
| 2002/0080356 A1 | 6/2002 | McMillen et al. .......... 356/445 |
| 2004/0005745 A1 | 1/2004 | Nakamura .................. 438/174 |
| 2004/0218180 A1 | 11/2004 | Rosencwaig et al. ....... 356/369 |

OTHER PUBLICATIONS

International Search Report (ISR) in PCT/US2005/003441.
Written Opinion in PCT/US2005/003441.
Entire File History of U.S. Appl. No. 09/974,571 including any Office Actions and Amendments therein.
Entire File History of U.S. Appl. No. 11/173,665 including any Office Actions and Amendments therein.

*Primary Examiner*—Nikita Wells
*Assistant Examiner*—David A. Vanore
(74) *Attorney, Agent, or Firm*—Omkar Suryadevara (57) ABSTRACT

A method that is sensitive to lattice damage (also called "primary method") is combined with an additional method that independently measures one of two parameters to which the primary method is sensitive namely dose and energy. In some embodiments, the additional method is sensitive to dose, and in two such embodiments 4PP and SIMS are respectively used to measure dose (independent of energy). In other embodiments, the additional method is sensitive to energy, and in one such embodiment SIMS is used to measure energy (independent of dose). Use of such an additional method resolves an ambiguity in a prior art measurement by the primary method alone. The two methods are used in combination in some embodiments, to determine adjustments needed to match two or more ion implanters to one another or to a reference ion implanter or to a computer model.

15 Claims, 6 Drawing Sheets

MATCHING DOSE AND ENERGY OF MULTIPLE ION IMPLANTERS

BACKGROUND

Figure 1A:
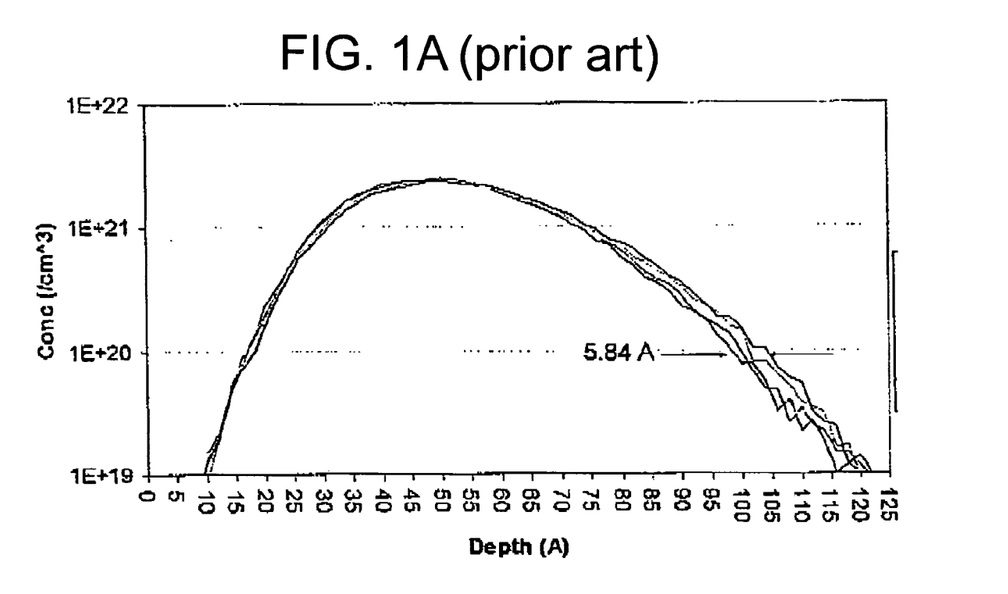
FIG. 1A is a graph showing a calculated depth profile for a typical implant in the prior art.

In the processing of a semiconductor wafer to form integrated circuits, charged atoms or molecules (such as arsenic, boron or phosphorous) are directly introduced into the wafer to create doped regions, in a process called ion implantation. FIG. 1A illustrates a profile that has been calculated for a typical implant: Arsenic at a nominal energy of 2 keV and dose of $1\times10^{15}$ atoms/cm$^2$. As shown in FIG. 1A, a depth range of 5.8 angstroms is obtained for a 200 eV energy range, i.e. about 35 eV/angstrom. Note that greater energy results in a deeper distribution. Note also that an increase in dose increases the height of the distribution, if energy is constant. Moreover, an increase in dose increases the depth, if concentration is constant.

Ion implantation normally causes damage to the lattice structure of the wafer. Specifically, in the implantation process, silicon atoms are knocked out of the lattice, and result in vacancies. To remove such lattice damage, the wafer is normally annealed at an elevated temperature, typically 600° C. to 1100° C. Prior to annealing, material properties of the doped regions (such as the concentration of the implants and the depth of the implants) may be measured.

Figure 1B:
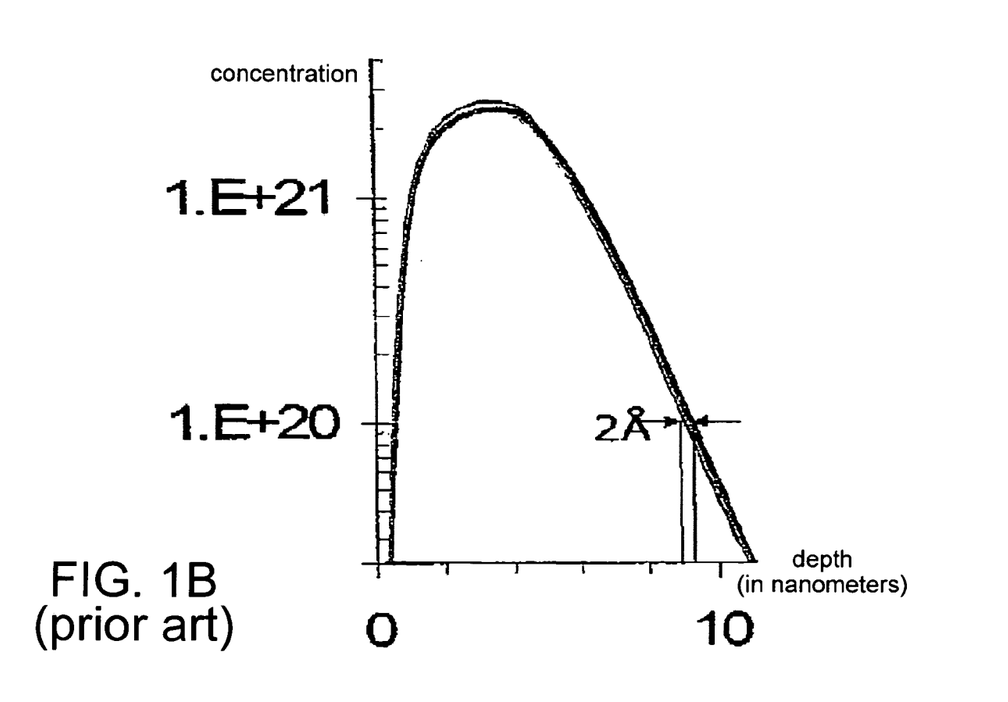
FIG. 1B is a graph of the depth profile in nanometers as measured by use of SIMS in the prior art.

In an implant metrology tool, secondary ion mass spectrometry (SIMS) can be used to determine the profile of the ion implants (i.e. their concentration as a function of depth from the wafer surface). The depth of the profile (at a nominal dose) indicates a measure of the energy used in the ion implantation process. The area under the profile is a measure of the dose of the ion implants. FIG. 1B illustrates a SIMS measurement of concentration as a function of depth from several implanted wafers using the above-described 2 keV and $1\times10^{15}$ atoms/cm$^2$ process (see paragraph [0001] above). In FIG. 1B, the x axis shows the depth in nanometers and the y axis shows the concentration/cm$^3$ (in atoms/cm$^2$). Note that the deepest and shallowest curves in FIG. 1B are from two wafers that have been processed by a single ion implanter. Since the energy of the ion implanter is better controlled than dose, the energy should be constant, and for this reason, the SIMS process appears to have a depth resolution no better than 1 angstrom, corresponding to ±35 eV of energy.

The SIMS process involves bombarding the wafer with atoms (e.g., oxygen atoms) which collide with atoms on the wafer surface and cause the atoms to be ejected from the surface (i.e., sputtering). During the energy transfer process, a small fraction of the ejected atoms leave as either positively or negatively charged ions which are collected by the mass spectrometer. The ion yield of the wafer is measured and a linear dependence between the ion yield and the doping concentration is used to determine the profile. Since material is sputtered form the processed wafer, causing damage to the sputtered region and re-deposition on nearby regions, the test is destructive and cannot be performed on production wafers during semiconductor wafer fabrication.

Another implant metrology tool uses a four point probe (4PP) arrangement. Specifically, the 4PP arrangement contacts the wafer's surface with four probes arranged in a straight line. Two outer-most probes are used to establish a flow of current through the implanted layer, while the two inner probes are used to measure a voltage drop. The measured voltage is used to deduce the sheet resistance and hence conductivity of the implanted layer and hence the dose. Note that the 4PP arrangement is insensitive to energy used in the ion implantation process. The probes must make contact with the wafer surface, which is considered a destructive process. Also, the measurement needs a large open area of several square millimeters. For these reasons, the 4PP technique is not normally used for process control on production wafers during semiconductor wafer fabrication.

There are several implant metrology tools that measure the damage to the lattice structure in a non-contact manner which is essential to monitor and control the fabrication of wafers. For example, a brochure entitled "TP-500: The next generation ion implant monitor" dated April, 1996 published by Therma-Wave, Inc., 1250 Reliance Way, Fremont, Calif. 94539, describes an implant metrology tool called "TP-500" that requires "no post-implant processing" (column 1, lines 6–7, page 2) and that "measures lattice damage" (column 2, line 32, page 2). The TP-500 includes "[t]wo low-power lasers [that] provide a modulated reflectance signal that measures the subsurface damage to the silicon lattice created by implantation. As the dose increases, so does the damage and the strength of the TW signal. This non-contact technique has no harmful effect on production wafers" (columns 1 and 2 on page 2). Such a TW signal is believed to be the result of carrier waves as described in one or more of the following U.S. Patents all of which are incorporated by reference herein in their entirety, namely U.S. Pat. No. 5,042,952 granted to Opsal et al., U.S. Patent.

Damage to the lattice structure can also be evaluated in a non-contact manner by illumination of carriers without creating waves by use of another implant metrology tool called "BX-10" that is available from Applied Materials, Inc., 3050 Bowers Avenue, Santa Clara, Calif. 95054. Carrier illumination is briefly described in U.S. Pat. No. 6,656,749 granted to Paton et al. which is incorporated by reference herein in its entirety. This patent suggests detecting the depth of the source/drain region using a low power laser to excite carriers in the active silicon and a second laser to illuminate the surface. Through use of interferometry, the difference in index of refraction between silicon with excited carriers and silicon with non-excited carriers is to be determined. From the difference in index of refraction, a measurement as to the depth of the activated source/drain regions is to be made. Carrier illumination methods may also be performed as described in each of the following U.S. patents all of which are incorporated by reference herein in their entirety, namely U.S. Pat. No. 6,489,801, U.S. Pat. No. 6,426,644, and U.S. Pat. No. 6,483,594 and U.S. Pat. No. 6,323,951.

The above-described non-contact methods appear (to the inventor of the current invention) to have the following drawback. Specifically, to the extent such methods are based on measuring the damage to the lattice (i.e. the vacancy concentration), the inventor notes that the damage is a function of both dose and energy used during ion implantation. The inventor further notes that higher energy or higher dose, each creates a greater number of vacancies. For this reason, a change in a signal measured by the lattice-damage sensitive methods can indicate a change in either energy or dose (without being able to distinguish therebetween). Hence, an error in dose is easily confused with an error in energy when using a lattice-damage sensitive method.

U.S. Pat. No. 5,862,054 which is incorporated by reference herein in its entirety describes a method to monitor process parameters from multiple process machines to provide real time statistical process control. In this patent, the particular implementation was derived from ion implantation of wafers, but has wide applicability where there are a number of process machines having a number of process parameters and close continuous sampling of data is required. The process parameters are collected on a single computer over a single RS 485 network, and each parameters is analyzed and displayed separately for each process and process machine. Statistical variables like Cp and Cpk arc calculated and presented on the computer screen along with graphs of the various parameters for a particular process machine. Data is aged out of the computer to an archival data base under the control of a manufacturing information system and connected to a company wide network.

U.S. Pat. No. 6,408,220 which is incorporated by reference herein in its entirety describes a a manufacturing environment for a wafer fab, and a statistical process control (SPC) environment for setting control limits and acquiring metrology data of production runs. A computation environment processes the SPC data, which are then analyzed in an analysis environment. A manufacturing execution system (MES) environment evaluates the analysis and automatically executes a process intervention if the process is outside the control limits.

SUMMARY

In accordance with the invention, a method (also called "primary method") that is inherently sensitive to two parameters of a wafer fabrication process, is used with an additional method that independently measures at least one of the two parameters. Specifically, in some embodiments, measurements made by the primary method and the additional method are used together to match to one another multiple apparatuses each of which implements the wafer fabrication process, so that all apparatuses perform the wafer fabrication process in an identical manner. After matching, wafers produced by the multiple apparatuses have identical values for the two parameters, regardless of the apparatus that was used.

In several embodiments of the invention, the apparatuses are ion implanters and the primary method is sensitive to lattice damage, and hence it is inherently sensitive to both dose and energy. In some embodiments, the additional method is sensitive to dose of implants and in one such embodiment a four point probe (4PP) apparatus of the type described above is used to measure dose (independent of energy). Use of the additional method resolves an ambiguity in the prior art measurement by use of the primary method alone, which as noted above is inherently sensitive to both parameters (dose and energy).

The two methods are used in combination to determine adjustments needed to match two or more ion implanters as follows. Specifically, in some embodiments, a first wafer that has been implanted by an ion implanter is evaluated using the additional method, to obtain a measurement indicative of dose. Next, an adjustment to be made in the dose is determined based at least on (a) the just-described measurement and (b) a predetermined value for the dose as used in implanting the first wafer. Then the dose on the ion implanter is changed by the just-described adjustment.

Next, a second wafer is implanted by the ion implanter which has been adjusted as described above. Then, the second wafer is evaluated using the primary method (which as noted above is sensitive to dose and energy). Then an adjustment in energy is determined based at least on (a) a second measurement obtained from evaluation of the second wafer by the primary method and (b) a predetermined value of energy used in the ion implanter when implanting the second wafer. Then the energy setting in the ion implanter is changed by the just-described adjustment.

The above-described process may be repeated for any number of ion implanters, to match several ion implanters to one another (because all such implanters are matched to predetermined values of dose and energy). Moreover, the primary method and the additional method may be calibrated on an ion implanter which acts as a reference (in which case all other ion implanters are adjusted to the reference implanter).

DETAILED DESCRIPTION

A method that is sensitive to lattice damage (also called "primary method") is used, in accordance with the invention, with an additional method that independently measures either dose or energy. In some embodiments, the additional method is sensitive to dose, and in two such embodiments 4PP and SIMS are respectively used to independently measure the dose. In other embodiments, the additional method is sensitive to energy, and in one such embodiment SIMS is used to independently measure energy. Regardless of which parameter (dose or energy) is measured by the additional method, use of the additional method resolves an ambiguity in use of primary method alone (due to its sensitivity to both dose and energy).

Figure 2:
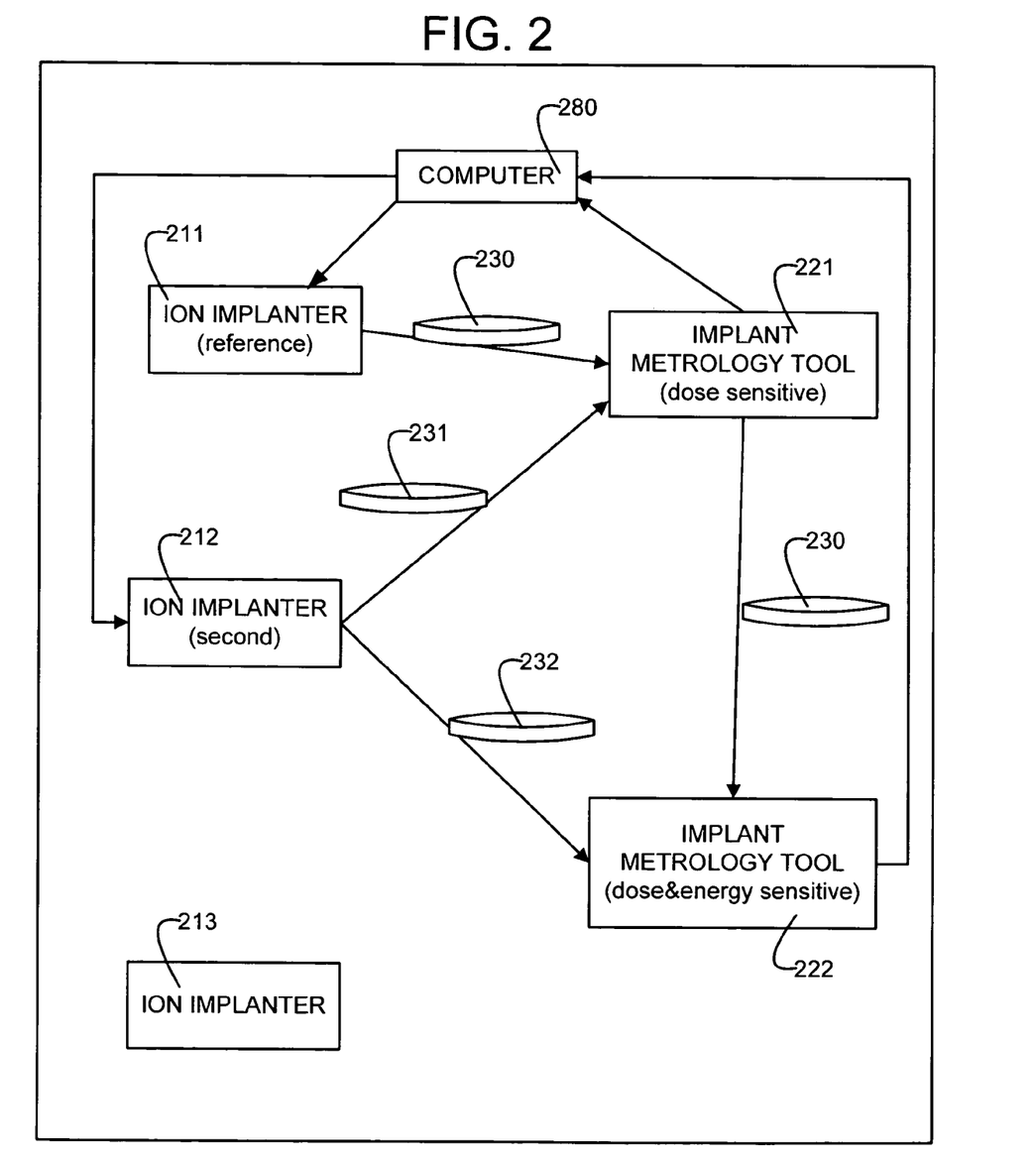
FIG. 2 illustrates, in a block diagram, various wafer fabrication devices and metrology tools used in some embodiments of the invention.

In one particular embodiment, a computer 200 (FIG. 2) is programmed to use a dose-sensitive method and a lattice-damage sensitive method to match the dose and energy of multiple ion implanters 211, 212 and 213 as follows. Note that although only three ion implanters are illustrated in FIG. 2, any number of such ion implanters (or other such wafer fabrication devices) may be matched as described herein. Note also that these implanters may be at a common facility, or may be at two or more fabrication lines. Depending on the embodiment, such fabrication lines may be in the same geographic location (e.g. Hsin-Chu, Taiwan), or in different geographic locations (e.g. anywhere in the world).

Initially, an ion implanter 211 is designated as a reference. A set of wafers 230 (say five wafers) are thereafter implanted (as per act 401 in FIG. 4) using this reference implanter 211 at a constant energy (say 2 keV) but at progressively greater doses (say 0.8, 0.9, 1.0, 1.1 and $1.2 \times 10^{15}$ atoms/cm$^2$). The implanted set of wafers 230 (also called "reference wafers") are thereafter evaluated (as per act 402 in FIG. 4) using each of two implant metrology tools 221 and 222 (FIG. 2) that are respectively sensitive to dose and to lattice damage.

Figure 3A:
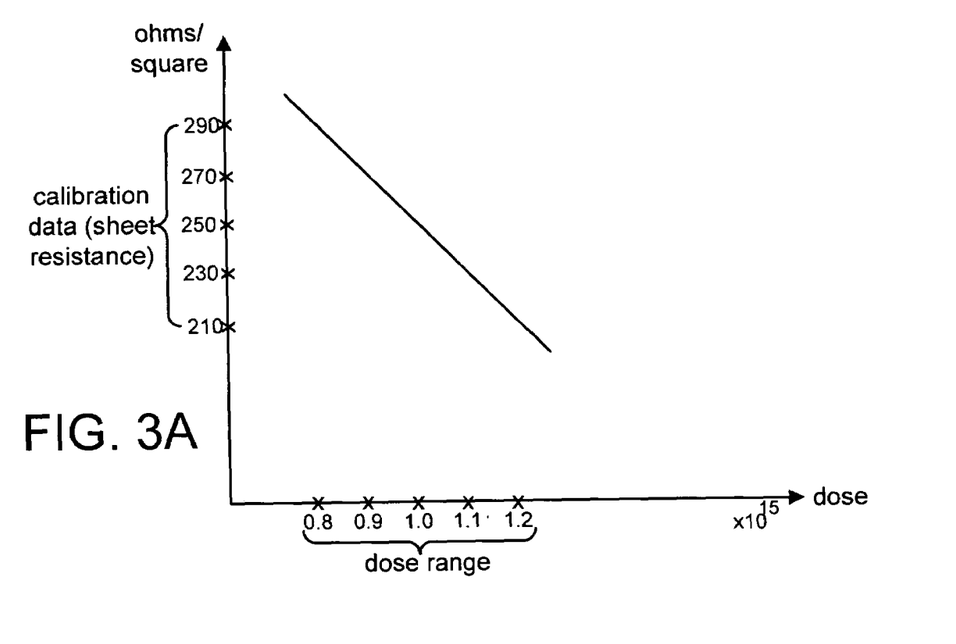
FIGS. 3A and 3B illustrate, in graphs, measurements obtained from a dose-sensitive method that determines sheet resistance, and a lattice-damage sensitive method respectively for a set of reference wafers implanted at nominal energy but at different doses, in accordance with the invention.
Figure 3B:
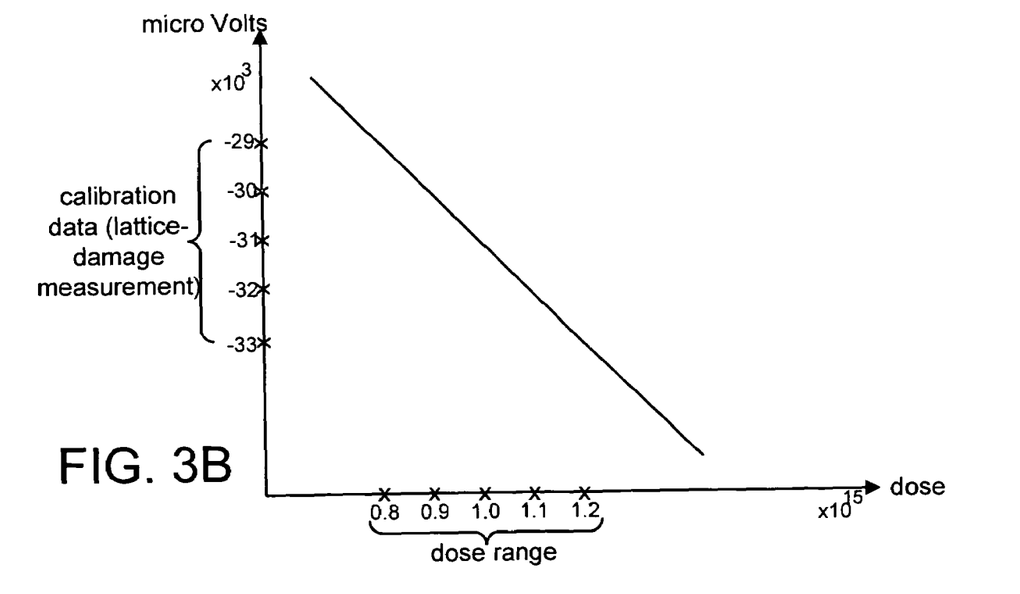

Specifically, FIG. 3A illustrates, in a graph, data obtained during evaluation of reference wafers 230 by implant metrology tool 221 (FIG. 2) which uses the above-described additional method that is dose sensitive independent of energy (and may be based on any conventional dose measurement technique such as 4PP or SIMS). In the example of FIG. 3A, tool 221 contains a 4PP dose measurement technique of the type described above in the Background section, but it will be apparent to the skilled artisan that a different dose measurement technique (such as SIMS) is used in alternative embodiments of tool 221. FIG. 3B illustrates, also in a graph, data obtained during evaluation of the reference wafers by implant metrology tool 222 (FIG. 2) which uses the above-described primary method that is sensitive to lattice damage (and hence sensitive to both dose and energy). Tool 222 may be based on any conventional technique sensitive to lattice damage such as a carrier illumination or alternatively a carrier wave method. The data illustrated in FIGS. 3A and 3B is also referred to herein as "calibration" data.

Figure 4:
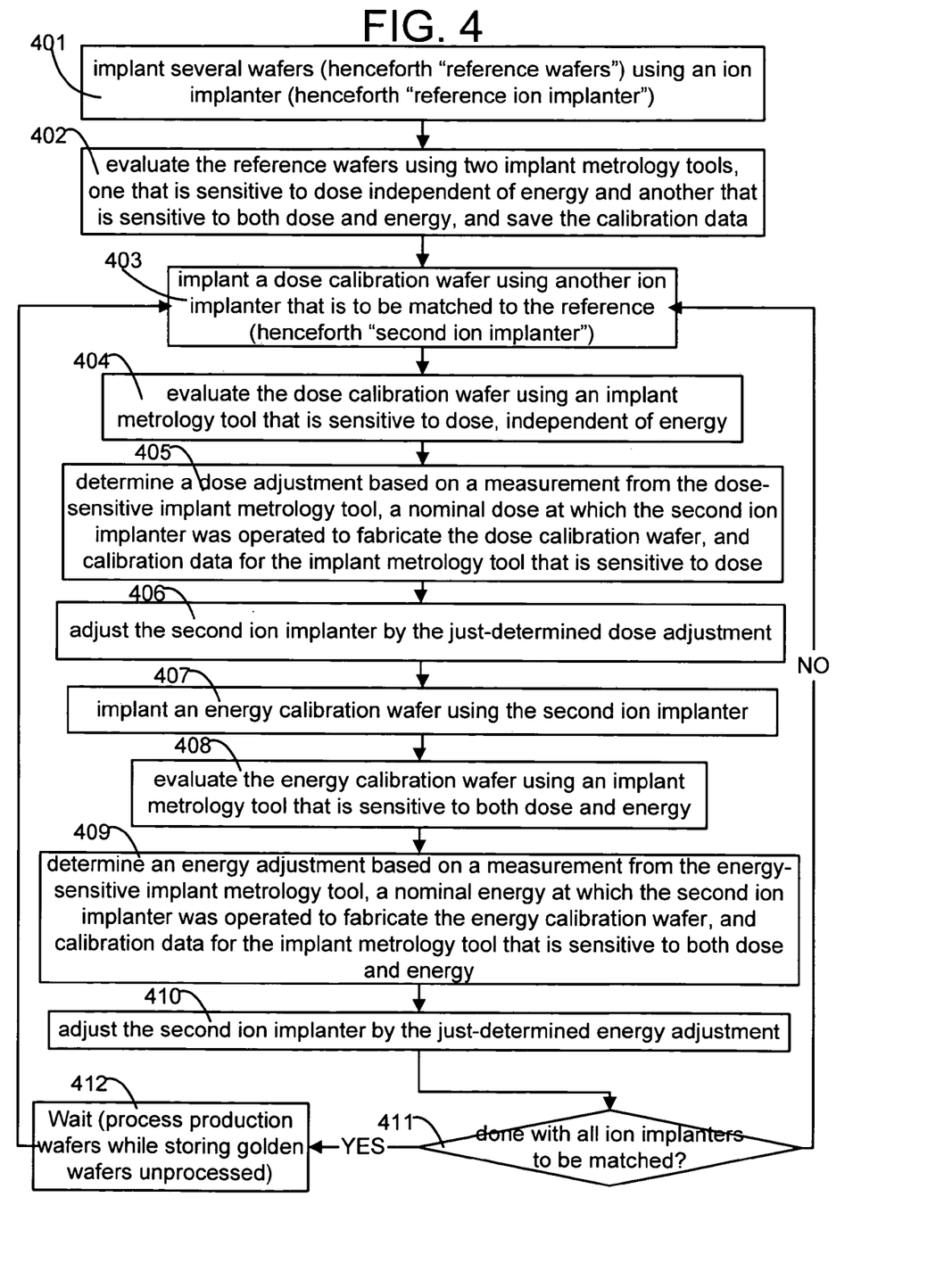
FIG. 4 illustrates, in a flow chart, acts performed by an embodiment of the invention to match two or more ion implanters in a semiconductor wafer fabrication facility.

Next, in the just-described embodiment shown in FIG. 2, another ion implanter 212 (also called the "second" implanter) that is to be matched to the reference implanter 211 is used to implant a wafer 231 (also called "dose-calibration wafer"), as illustrated by act 403 in FIG. 4. During implantation by the second implanter 212, the above-described constant energy (say 2 keV) is again used, and the dose knob is nominally set to the middle of the range of doses used with the reference implanter 211 (say $1.0 \times 10^{15}$ atoms/cm$^2$). Next, the dose-calibration wafer 231 is evaluated (as per act 404 in FIG. 4) in implant metrology tool 221 using the dose-sensitive method (e.g. 4PP or SIMS).

Figure 5A:
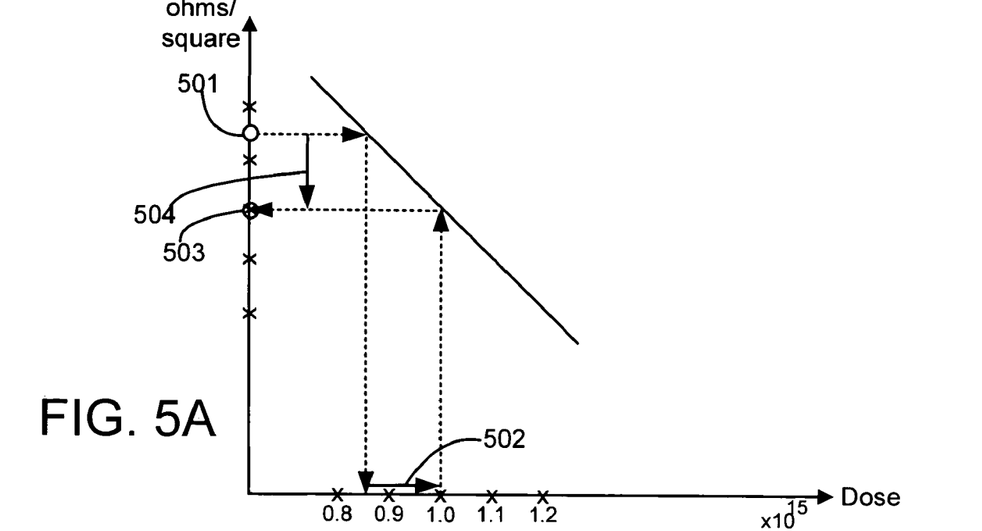
FIGS. 5A and 5B illustrate use of the graphs of FIGS. 3A and 3B when performing the method of FIG. 4.

The measurement from the dose-sensitive method is then used with above-described data (also called "calibration" data) from reference wafers (for the dose-sensitive method) to look up the dose (this looked-up dose is now in accordance with the reference implanter 211). Specifically, a measurement 501 from tool 221 is illustrated in FIG. 5A as being used to look up the dose as being $0.85 \times 10^{15}$ atoms/cm$^2$. Note that the graph in FIG. 5A is identical to the graph in FIG. 3A, and a separate figure is provided for convenience in illustrating lookup, and an adjustment which is discussed below.

Such a lookup may be performed manually in some embodiments, although it may also be performed by a computer. In the embodiment illustrated in FIG. 2, a computer 200 is coupled to implant metrology tool 221 to receive therefrom the dose measurement 501, and furthermore computer 200 contains the data illustrated in FIG. 3A which is used to identify the looked-up dose.

Next, as per act 405 in FIG. 4, a dose adjustment is determined, e.g. as the difference between the looked-up dose (in this example of $0.85 \times 10^{15}$ atoms/cm$^2$) and a nominal dose (in this example of $1.0 \times 10^{15}$ atoms/cm$^2$) that was to have been delivered as per the dose setting in second implanter 212. Then, the second implanter 212 is adjusted as per act 406 in FIG. 4, in the amount of the dose adjustment 502 (FIG. 5A). Note that in this example, dose adjustment 502 has the value $0.15 \times 10^{15}$ atoms/cm$^2$. After such adjustment of second ion implanter 202, tool 221 shows a change 504 in measurement on wafers henceforth prepared by implanter 212. Hence, the two implanters 211 and 212 henceforth deliver identical doses (i.e. wafers implanted in either implanter will have the same dose, as indicated by the measurement 503 in FIG. 5A).

At this stage, a dose knob on the second implanter 212 has been offset from the nominal dose (as indicated on the second implanter) by the just-described difference amount. In the above-described example, since the looked up dose of $0.85 \times 10^{15}$ atoms/cm$^2$ is lower than the nominal dose $1.0 \times 10^5$ atoms/cm$^2$, the dose knob of the second implanter 212 is now set at an increased setting, i.e. now appears to be implanting $1.15 \times 10^{15}$ atoms/cm$^2$ (which is greater than the nominal dose by the difference amount). However, in actual fact both implanters 211 and 212 hereinafter impart the same identical dose (i.e. the nominal dose as per the reference implanter) to all wafers processed therein.

Next another wafer 232 (also called "energy-calibration wafer") is implanted as per act 407 in FIG. 4 using the second implanter 212. Then the energy-calibration wafer 232 is evaluated as per act 408 in FIG. 4, in the other implant metrology tool 222 which uses a lattice-damage sensitive method. A measurement 511 from implant metrology tool 222 is then used with calibration data from reference wafers (for the damage-sensitive method) to identify a change to be made to the second ion implanter 212 in order to match its energy to the energy of the reference ion implanter 211.

Figure 5B:
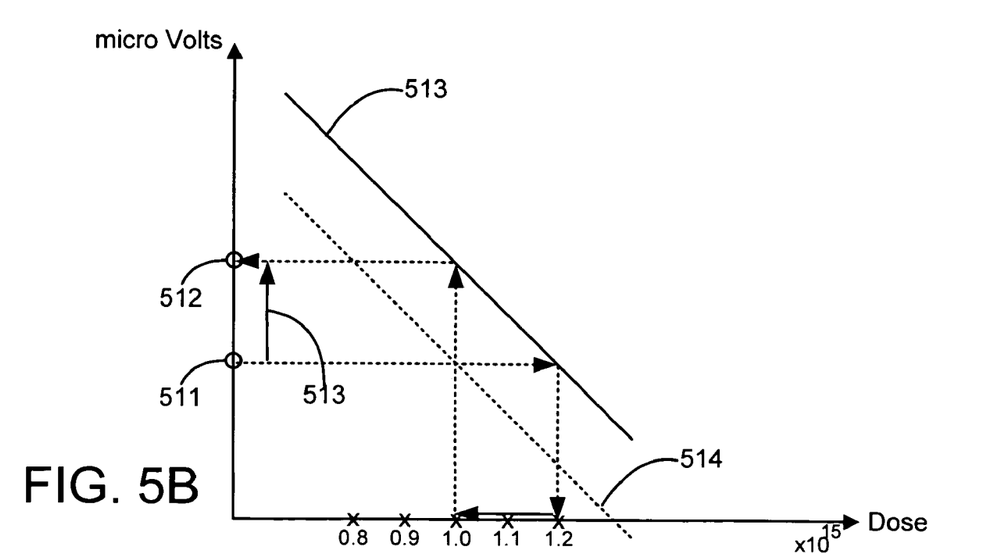

Specifically, when the measurement 511 is used with the dose line 513 for tool 222, as shown in FIG. 5B, the dose appears to be $1.2 \times 10^{15}$ atoms/cm$^2$ in the reference frame of the reference implanter 211. However, due to the dose adjustment 502 which has been already made, the dose is in fact only $1.0 \times 10^{15}$ atoms/cm$^2$ and it is the energy of implanter 212 that needs to be adjusted. The adjustment in energy should be sufficient to obtain measurement 512 from tool 222 (because 512 is the measurement that should be obtained for a dose of $1.0 \times 10^{15}$ atoms/cm$^2$). The amount of energy adjustment to be done to obtain a measurement 512 (FIG. 5B) from a wafer processed by the second ion implanter 212 may be determined either by trial and error, or from additional calibration data. In the above described example, a 2 keV implant of Arsenic results in a 95 angstrom depth, and the signal is 31,000 µV, and the response is 326 µV/angstrom. If the slope of the energy-depth calibration from a computer program (commonly known as "TRIM model") is 35 eV/angstrom, then the adjustment is 0.107 eV/µV. Note that the TRIM model uses a Monte Carlo method to calculate scattering of implant ions in amorphous targets to show the depth of the ion implant distribution. For example, the TRIM model is run for a set of As implant energies of 1900, 1950, 2000, 2050 and 2100 eV. The depth range is found to be 5.84 Å, and the energy-depth calibration is (2100–1900 eV)/5.84 Å=200 eV/5.84 Å=35 eV/A.

Figure 6:
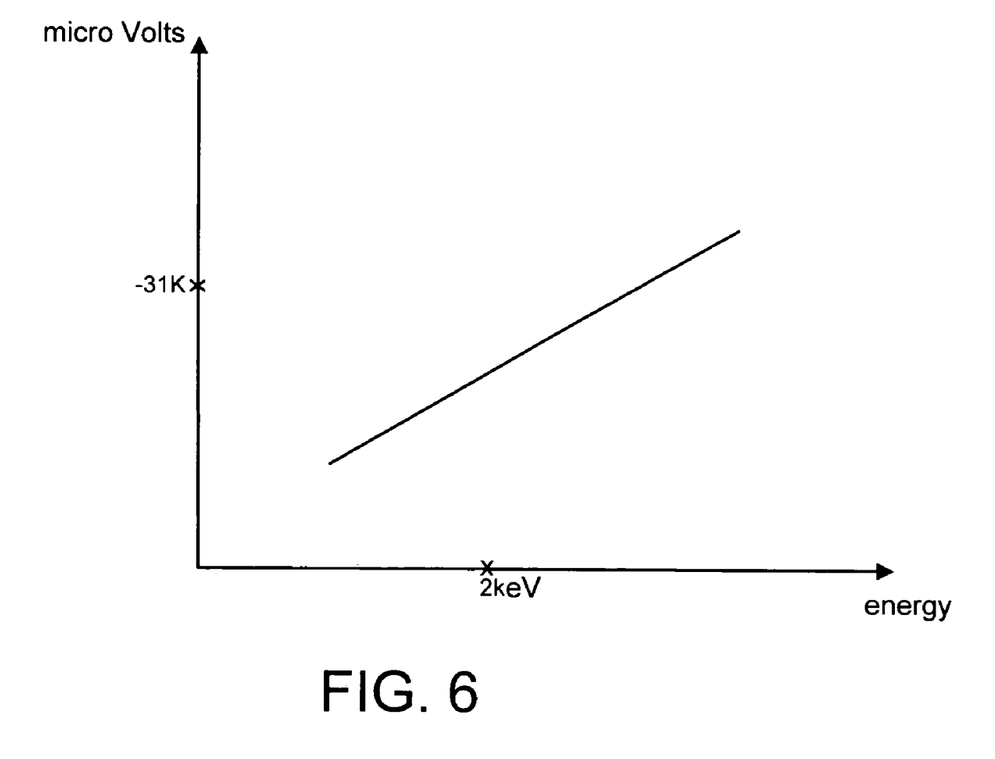
FIG. 6 illustrates, in a graph, energy response of the lattice-damage sensitive method in one illustrative embodiment of the invention.

Assume that the difference between values 511 and 512 is 2000 uV, then this difference may be multiplied by the slope of the energy curve (which is shown in FIG. 6 and discussed below) In this example, the implanter energy needs to be reduced by 2000 uV×0.107 eV/uV=214 eV in order to match the dose curves. This energy adjustment drops original line 513 in FIG. 5B so that value 511 intersects the new line 514 at a dose of $1.0 \times 10^{15}$.

FIG. 6 illustrates, in a graph the signal response of tool 222 as a function of energy, assuming the dose is kept constant. Such a graph may be obtained in the manner described above for FIG. 3A, namely by use of a number of wafers that are implanted at different energy levels (e.g. 1000 eV, 1500 eV, 2000 eV, 2500 eV and 3000 eV), while keeping dose at a fixed level of, for example, $1.0 \times 10^{15}$ atoms/cm². The slope of such a graph (e.g. 0.107 µV/eV) is used in some embodiments, as noted above, to identify the amount of energy adjustment to be done to implanter 212 so as to match it to implanter 211.

Such additional calibration data may, for example, relate measurements from tool 222 to corresponding energy levels (not shown, but the graph would be similar to FIG. 3B except that on the x-axis the dose values are replaced by energy values). Alternatively, the additional calibration data may relate the dose values (as shown on the x-axis in FIG. 3B) to energy values, so that after a dose value of $1.2 \times 10^{15}$ atoms/cm² is found from measurement 511, a corresponding energy value e.g. 214 eV is found from the additional calibration data.

Next, as shown by act 410 in FIG. 4, the energy of second implanter 212 is adjusted in the amount of the energy adjustment, so that henceforth the two implanters 211 and 212 deliver the same dose and also the same energy. At this stage an energy knob of the second implanter 212 is no longer at nominal energy, but is offset therefrom due to a difference in nominal energy imparted by the two implanters.

Such a method may be repeated if there are any additional ion implanters (such as implanter 213) that need to be matched to the reference ion implanter 211, as illustrated by the "no" branch out of act 411 in FIG. 4. Ion implanters 211–213 after being matched as described herein can be used to parallelize the ion implantation process, e.g. to mass produce wafers having identical implants (relative to one another, i.e. regardless of the ion implanter that has been used). Alternatively, a wafer that is to be implanted by implanter 211 may instead be implanted by implanter 212 or implanter 213 depending on which of them is available, without making the wafer wait for implanter 211 to become available. This is called implanter matching, and allows the factory to run more efficiently, because all implanters deliver exactly the same process, so that any available implanter can be used to run a process.

Note that, the just-described method may be repeated after waiting for some time (as per the "yes" branch of act 411 and act 412) to re-align implanters 211–213 to one another, for example in case they drift away during wafer fabrication, or in case maintenance work was done on an implanter. The duration of waiting in act 412 depends on specific characteristics of the ion implanters and is determined by trial and error. Such a waiting period may be based either on a fixed time interval or on the number of wafers that have been processed or any other appropriate measure of usage of ion implanters.

In one specific embodiment, the energy resolution (FIG. 5B) is at least an order of magnitude better than the prior art method based on SIMS. Such an order of magnitude improvement over the prior art provides a critical advantage in advanced implants wherein the energy sets the junction depth, permitting very tight energy control. Moreover, this specific embodiment has another advantage which is that a SIMS based implant metrology tool is not often readily available whenever two or more ion implanters need to be matched. The method of the type illustrated in FIG. 4 avoids the need for a SIMS tool for matching ion implanters, by use of the 4PP arrangement during act 402, which is followed by performance of act 408, for example using BX-10 (which is described in the Background section above).

In an embodiment that performs the method of FIG. 4, one ion implanter, namely the reference ion implanter 211 is not adjusted at all (because all other ion implanters are adjusted to it). In an alternative embodiment, an ion implanter that is physically located in a semiconductor wafer fabrication facility is not used as a reference. Instead, the primary method and the additional method are calibrated to nominal values for dose and energy that are computed, for example, from a computer model (in which case the computer model serves as the reference instead of using the reference implanter). In such an embodiment, all ion implanters that need to be matched are adjusted.

In some embodiments, one or more wafers that are implanted by the reference implanter 211 at the time it is originally calibrated (for a given implant process) are stored away unprocessed in order to provide a standard for future calibrations. For example, one of the above-described reference wafers which already has the nominal dose of $1.0 \times 10^{15}$ atoms/cm² and nominal energy of 2 keV for the current implant process may be kept unprocessed (and is hereinafter referred to as a "golden wafer"). If such a reference wafer (at the nominal energy and nominal dose) doesn't exist, then it is created on reference implanter 211. Thereafter, the matched ion implanters (including the reference implanter) are used in the normal manner to process wafers (called "production wafers") while the golden wafer remains unprocessed. The golden wafer is saved away to provide a snapshot of dose and energy settings within the reference implanter 211 at the time of original matching of ion implanters for the current implant process (e.g. when act 402 of FIG. 4 is first performed).

At any time in future, such a golden wafer may be used in the above-described manner to adjust one or more ion implanters back to their original values, e.g. to perform act 403 directly after act 412 (FIG. 4). Therefore, one or more golden wafers that are not processed any further (i.e. additional steps to form integrated circuit dice are not performed thereon), are used in some embodiments to match a given implant process across a period of time.

Creation and use of golden wafers ensures that the current implant process is repeatably performed at any time in future in an identical manner to the past, even if the reference ion implanter itself drifts from its original settings, is used for a different implant process in the interim, or loses its original calibration because of maintenance work. Re-creation of a current process at any time in future becomes possible because even the reference ion implanter may be appropriately adjusted for dose and energy in embodiments of the type described above, simply by use of a golden wafer.

Therefore, in some embodiments, one or more golden wafers are used to match only the reference implanter to its original settings (i.e. the entire matching method is performed only on a single ion implanter, namely the reference ion implanter). In such embodiments, act 411 (FIG. 4) is not performed, act 412 is performed between acts 402 and 403, and acts 403–410 are performed on the reference ion implanter at the current time (which is treated as the second ion implanter).

Note that such golden wafer(s) (which contain a snapshot of dose and energy implanted therein) can also be used to re-create a current process at any wafer fab, at any location (i.e. anywhere in the world) because such golden wafer(s) can be quickly and easily transported to any location. Thus use of golden wafers allows flexible performance of a current process at any geographic location and also at any point in time.

Identity between dose and energy values in the past and in the future are not required in some embodiments, e.g. if a current process will never need to be performed in future, e.g. if a new version of the current process is to be performed. In such a case, "golden wafers" are not required to be kept across multiple version of the process. Instead, after act 412, the entire process is repeated by returning to act 401 (i.e. instead of returning to act 403, reference wafers are again prepared in act 401, in order to match ion implanters to one another once again).

Although one or more golden wafers are described above as being prepared at nominal dose and nominal energy, other embodiments may use golden wafers at dose and energy levels that are different from the nominal dose and nominal energy, e.g. at one or more predetermined sets of dose and energy levels that are within upper and lower limits for a given process (e.g. approximately in the middle).

Note that in FIG. 5A, the direction of an arrowhead from a measurement illustrates the direction in which a lookup is performed in an illustrative embodiment of the invention. More specifically, FIG. 5A illustrates the manner in which starting from measurement 501 a lookup is performed to obtain the value 503 which is then used to compute the dose adjustment 504. Note however, that other embodiments may store and use such data in other forms, such as a tabular form instead of a graph.

Numerous such modifications and adaptations of the embodiments and examples described herein are encompassed by the attached claims.

What is claimed is:

1. A method of adjusting an ion implanter, the method comprising:
   evaluating a first wafer using a first method that is sensitive to a first parameter selected from a group consisting of dose and energy, the first method measuring the first parameter independent of a second parameter in said group;
   determining a first adjustment in the first parameter based at least on (a) a first measurement obtained from said evaluating of first wafer and (b) a predetermined value of the first parameter in an ion implanter used to implant the first wafer;
   evaluating a second wafer using a second method that is sensitive to both the first parameter and the second parameter, wherein the second wafer is implanted by said ion implanter after said first adjustment is made; and
   determining a second adjustment in the second parameter based at least on (a) a second measurement obtained from said evaluating of second wafer and (b) a predetermined value of the second parameter in said ion implanter when implanting the second wafer.

2. The method of claim 1 wherein:
   the first parameter is dose and the second parameter is energy.

3. The method of claim 2 wherein:
   the first method uses a four point probe (4PP) apparatus to measure dose during said evaluating.

4. The method of claim 2 wherein:
   the first method uses secondary ion mass spectrometry (SIMS) to measure dose during said evaluating.

5. The method of claim 2 wherein:
   the second method uses a carrier wave.

6. The method of claim 2 wherein:
   the second method uses carrier illumination.

7. The method of claim 2 wherein the ion implanter is hereinafter "second ion implanter" and the method comprises:
   using a first ion implanter to implant a plurality of reference wafers at a corresponding plurality of doses;
   evaluating the reference wafers using the first method to obtain calibration data for the first method;
   evaluating the reference wafers using the second method to obtain calibration data for the second method;
   before said evaluating of the first wafer, implanting the first wafer by using the second ion implanter set to said predetermined value of the first parameter;
   wherein said determining of first adjustment comprises using the first measurement with the calibration data for the first method to determine a first dose, and comparing said first dose with said first measurement to identify said first adjustment;
   making the first adjustment on the second ion implanter; and
   before said evaluating of the second wafer, implanting the second wafer with the second ion implanter after said first adjustment is made;
   wherein said determining of second adjustment comprises using the second measurement with the calibration data for the second method to identify said second adjustment.

8. The method of claim 1 wherein:
   the first parameter is energy and the second parameter is dose.

9. The method of claim 8 wherein:
   the first method uses secondary ion mass spectrometry (SIMS) to measure energy during said evaluating.

10. The method of claim 9 wherein:
    the second method uses a carrier wave.

11. The method of claim 9 wherein:
    the second method uses carrier illumination.

12. The method of claim 1 further comprising:
    implanting the first wafer with the ion implanter before said evaluating of the first wafer;
    making the first adjustment on the ion implanter; and
    implanting the second wafer with the ion implanter after said first adjustment is made.

13. The method of claim 1 wherein:
    the first method uses a dose measurement technique during said evaluating.

14. The method of claim 1 further comprising:
    using said ion implanter at nominal dose and nominal energy to implant a third wafer;
    storing the third wafer unprocessed while implanting a plurality of wafers using said ion implanter at nominal dose and nominal energy and further processing said plurality of wafers;
    wherein said evaluatings and determinings are performed subsequent to said storing; and
    wherein at least one of said determinings uses calibration data from said third wafer.

15. A method of adjusting an ion implanter, the method comprising:
    evaluating a first wafer using a dose-sensitive method;
    determining an adjustment in dose based on (a) a measurement obtained from said evaluating of first wafer, (b) calibration data for the dose-sensitive method, and (c) a dose used by an ion implanter in implanting the first wafer;
    evaluating a second wafer using another method that is sensitive to both dose and energy, wherein the second wafer is implanted by said ion implanter after said adjustment in dose is made; and
    determining an adjustment in energy for said ion implanter based at least on another measurement obtained from said evaluating of second wafer.

* * * * *